(12) United States Patent
Shin et al.

(10) Patent No.: US 7,885,117 B2
(45) Date of Patent: Feb. 8, 2011

(54) METHOD FOR PROGRAMMING NONVOLATILE MEMORY DEVICE

(75) Inventors: Chang-Hee Shin, Chungcheongbuk-do (KR); Ki-Seok Cho, Chungcheongbuk-do (KR); Si-Hyung Cho, Chungcheongbuk-do (KR)

(73) Assignee: Magnachip Semiconductor, Ltd., Cheongju-si, Chungcheongbuk-do (KR)

( * ) Notice: Subject to any disclaimer, the term of this patent is extended or adjusted under 35 U.S.C. 154(b) by 87 days.

(21) Appl. No.: 12/419,576

(22) Filed: Apr. 7, 2009

(65) Prior Publication Data

US 2009/0262565 A1    Oct. 22, 2009

(30) Foreign Application Priority Data

Apr. 16, 2008  (KR)  .................... 10-2008-0035209
May 15, 2008  (KR)  .................... 10-2008-0045126

(51) Int. Cl.
*G11C 16/04*    (2006.01)

(52) U.S. Cl. ..................... 365/185.19; 365/185.14; 365/185.22; 365/185.24

(58) Field of Classification Search ............ 365/185.19, 365/185.14, 185.22, 185.24
See application file for complete search history.

(56) References Cited

U.S. PATENT DOCUMENTS

| 5,784,317 | A | 7/1998 | Ha |
| 7,180,123 | B2 | 2/2007 | Yeh et al. |
| 7,426,138 | B1 * | 9/2008 | Wong .................... 365/185.03 |

OTHER PUBLICATIONS

Hyouk-Kyu Cha et al., "A 32-KB Standard CMOS Antifuse One-Time Programmable ROM Embedded in a 16-bit Microcontroller," IEEE Journal of Solid-State Circuits, vol. 41, No. 9, pp. 2115-2124, Sep. 2006.

* cited by examiner

*Primary Examiner*—Thong Q Le
(74) *Attorney, Agent, or Firm*—NSIP Law

(57) ABSTRACT

Disclosed is a method for programming a nonvolatile memory device including one time programmable unit cells. The method for programming a nonvolatile memory device including one time programmable (OTP) unit cells, the method comprising applying a pulse type program voltage having a plurality of cycles. The present invention relates to a method for programming a nonvolatile memory device, which can prevent malfunctions by enhancing a data sensing margin in a read operation through the normal dielectric breakdown of an antifuse during a program operation, and thus improve the reliability in the read operation of an OTP unit cell.

35 Claims, 10 Drawing Sheets

METHOD FOR PROGRAMMING NONVOLATILE MEMORY DEVICE

CROSS-REFERENCES TO RELATED APPLICATIONS

The present invention claims priority of Korean Patent Application Nos. 10-2008-0035209 and 10-2008-0045126, filed on Apr. 16, 2008, and May 15, 2008, respectively, which are incorporated herein by reference.

BACKGROUND OF THE INVENTION

1. Field of the Invention

The present invention relates to a method for driving a semiconductor memory device; and, more particularly, to a method for programming a nonvolatile memory device including one time programmable (OTP) unit cells.

2. Description of Related Art

One time programmable (OTP) unit cells are formed inside a volatile memory device such as Dynamic Random-Access-Memory (DRAM) or a nonvolatile memory device, such as Electrically Erasable Programmable Read-Only-Memory (EEPROM) or flash memory, and are used for memory repair purpose. In addition, OTP unit cells are used for internal operating voltage and frequency trimming in a mixed-signal chip where an analog chip and a digital chip are mixed.

Generally, each OTP unit cell includes an antifuse implemented with a metal-oxide-semiconductor field effect transistor, referred to as a MOS transistor hereafter, and one or more MOS transistors. Such an OTP unit cell is formed inside each memory chip in a single or array configuration and is used for repair or trimming.

Figure 1:
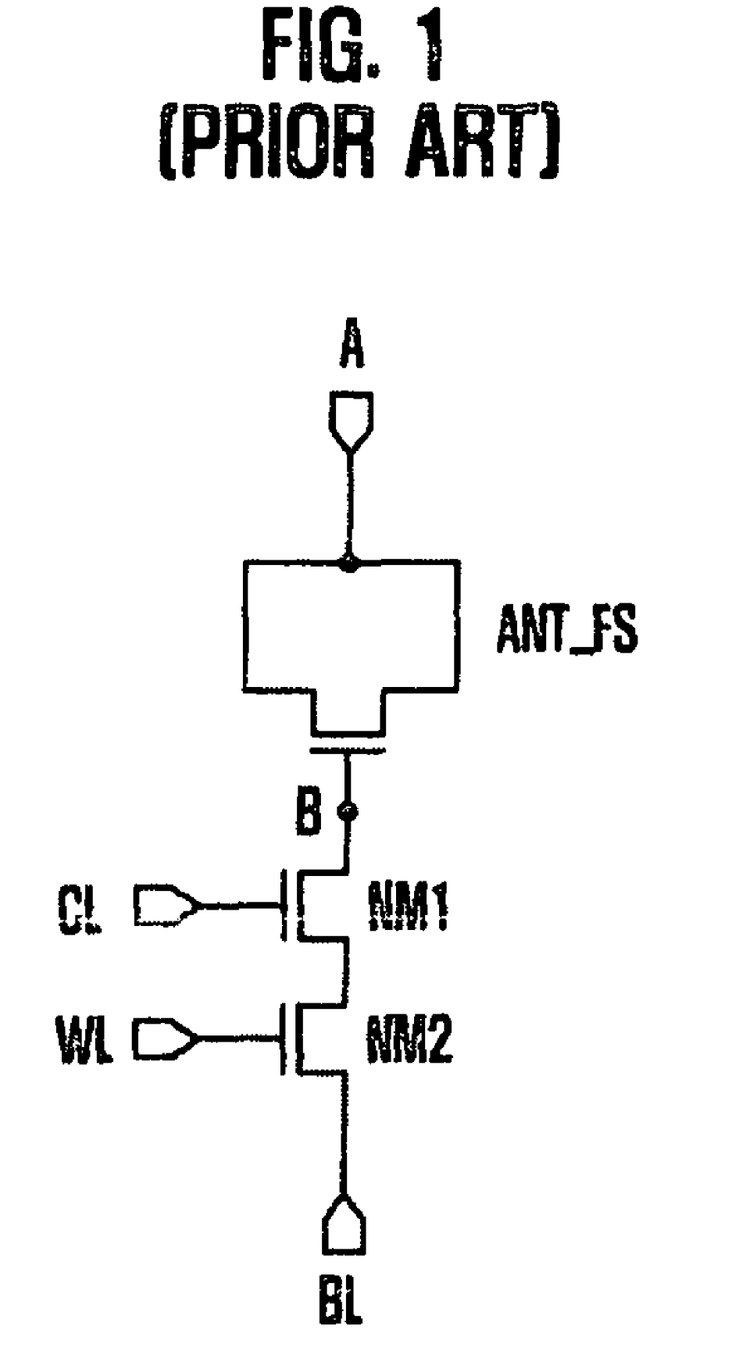
FIG. 1 is an equivalent circuit diagram of a typical OTP unit cell.

FIG. 1 is an equivalent circuit diagram of a typical OTP unit cell.

Referring to FIG. 1, the typical OTP unit cell includes an antifuse ANT_FS and transistors NM1 and NM2. The antifuse ANT_FS is connected between a node B and an input terminal through which a program voltage is inputted. The transistors NM1 and NM2 are n-channel transistors, and are connected in series between the node B and a bit line BL, which is a terminal through which data are outputted during read operation.

Figure 2:
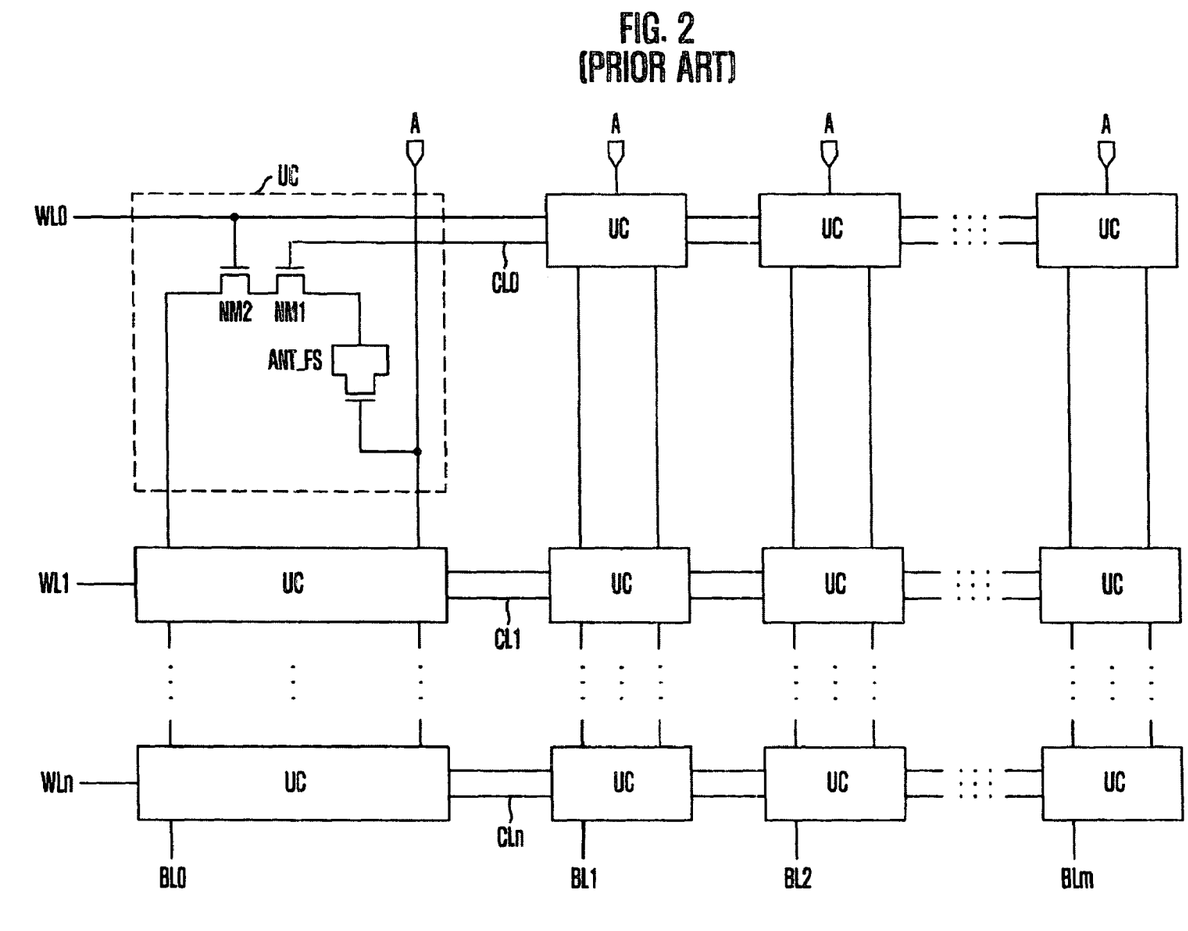
FIG. 2 is a block diagram illustrating a memory cell array of a typical nonvolatile memory device.

FIG. 2 is a block diagram illustrating a memory cell array of a typical nonvolatile memory device.

Referring to FIG. 2, the memory cell array of the typical nonvolatile memory device includes a plurality of unit cells UC arranged in a matrix form. As illustrated in FIG. 1, the unit cell UC includes first and second transistors NM1 and NM2 having n-channels connected in series and one antifuse ANT_FS connected to the first and second transistors NM1 and NM2 in series.

In addition, the memory cell array of the typical nonvolatile memory device includes a plurality of word lines WL0 to WLn, where n is a positive integer herein, configured to select the second transistor NM2 of the unit cell UC. Furthermore, the memory cell array includes a plurality of bit lines BL0 to BLm, where m is a positive integer herein, configured to sense data through a drain of the transistor NM1 to transfer it to a detecting unit (not shown). Moreover, the memory cell array includes a plurality of control lines CL0 to CLn configured to apply a bias voltage to a gate of the first transistor NM1 to thereby control the operation of the first transistor NM1.

Herebelow, description will be made on program and read operations of a conventional nonvolatile memory device.

Figure 3:
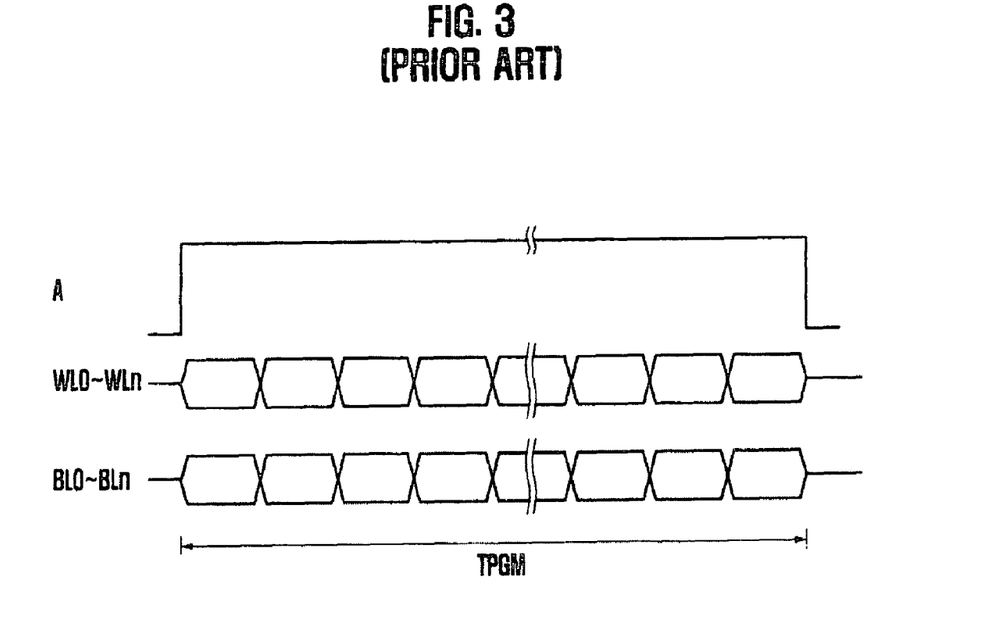
FIG. 3 is a waveform diagram illustrating a program operation of a conventional nonvolatile memory device.

FIG. 3 is a waveform diagram illustrating a program operation of a conventional nonvolatile memory device.

TABLE 1

| Operation mode/Terminal | A | CL0 to CLn | WL0 to WLn | BL0 to BLm |
|---|---|---|---|---|
| Program operation | VPP | H | H or L | VSS |
| Read operation | VDD | H | H or L | VSS |

Program Operation

Referring to Table 1 and FIG. 3, a high voltage VPP is applied to an input terminal A during a programming period TPGM. A first control signal having a first logic level corresponding to a power supply voltage VDD, referred to as logic high level hereafter, is inputted to the control lines CL0 to CLn as a bias voltage. A second control signal of logic high level is inputted to a selected word line of the word lines WL0 to WLn, and the second control signal having a second logic level corresponding to a ground voltage VSS, referred to as logic low level hereafter, is inputted to an unselected word line. The ground voltage VSS is applied to the bit lines BL0 to BLm.

In a selected cell in which a gate dielectric layer of the antifuse is broken down during the program operation, the first and second transistors NM1 and NM2 are turned on in response to the first and second control signals so that the selected bit line and the node B are electrically connected. This allows the ground voltage VSS to be applied to the node B. Accordingly, a high electric field is formed between a substrate and the gate of the antifuse ANT_FS implemented with a MOS transistor, leading to a dielectric breakdown of the gate dielectric layer formed between the gate and the substrate. Thus, the gate of the antifuse ANT_FS and the substrate are electrically shorted.

Read Operation

After the program operation, the power supply voltage VDD is applied to the input terminal A, and the first control signal of logic high level is inputted to the control line CL0 to CLn. The second control signal of logic high level is inputted to a selected word line of the word lines WL0 to WLn, and the second control signal of logic low level is inputted to an unselected word line. The bit lines BL0 to BLm are connected to the detecting unit (not shown). Accordingly, a current path is formed from the input terminal A to the bit line via the antifuse ANT_FS, the first transistor NM1, and the second transistor NM2. Thus, the power supply voltage VDD applied to the input terminal A is transferred to the bit line so that the power supply voltage VDD is detected through the bit line.

However, there are several limitations below in the program operation of the conventional nonvolatile memory device.

As illustrated in FIG. 3, the program operation of the conventional nonvolatile memory device is performed in a static stress manner that the program voltage with a constant level is continuously applied during the programming period TPGM to result in the dielectric breakdown of the gate dielectric layer of the antifuse ANT_FS. In such a static stress manner, electrons are trapped at an interface of the gate dielectric layer of the antifuse ANT_FS, and thus the electric field strength is reduced during the program operation. For this reason, the electric field is not sufficiently applied to the gate dielectric layer of the antifuse during the program operation so that the dielectric breakdown of the gate dielectric layer is not performed normally. Accordingly, a data sensing margin becomes poor to cause a malfunction to occur during the read operation, which degrades the reliability in the read operation of the OTP unit cell.

SUMMARY OF THE INVENTION

An embodiment of the present invention is directed to a method for programming a nonvolatile memory device, which can prevent malfunctions by enhancing a data sensing margin in a read operation through the normal dielectric breakdown of an antifuse during a program operation, and thus improve the reliability in the read operation of an OTP unit cell.

In accordance with an aspect of the present invention, there is provided a method for programming a nonvolatile memory device including one time programmable (OTP) unit cells, the method comprising applying a pulse type program voltage having a plurality of cycles.

In accordance with another aspect of the present invention, there is provided a program operation and a verify operation for performing within one cycle, and a next-cycle operation for performing depending on a result of the verify operation.

In accordance with still another aspect of the present invention, there is provided a method for programming a nonvolatile memory device having an OTP unit cell, the method including: performing a pre-program operation on the OTP unit cell; performing a verify operation on the OTP unit cell on which the pre-program operation is completed; and performing a post-program operation depending on a verification result.

In accordance with yet another aspect of the present invention, there is provided a method for programming a nonvolatile memory device having an OTP unit cell, the method including: performing a program operation on the OTP unit cell during a preset programming interval; detecting data from the OTP unit cell; comparing the detected data with a reference value; increasing the programming interval when the detected data differs from the reference value; and comparing the programming interval with a preset limit value, and performing a program operation on the OTP unit cell for the increased programming interval when the programming interval is smaller than the limit value.

In accordance with even another aspect of the present invention, there is provided a method for programming a nonvolatile memory device having an OTP unit cell, the method including: performing a program operation on the OTP unit cell with a preset program voltage; detecting data from the OTP unit cell; comparing the detected data with a reference value; increasing an amplitude of the program voltage when the detected data differs from the reference value; and comparing the program voltage with a preset limit value, and performing a program operation on the OTP unit cell with the program voltage when the amplitude of the program voltage is smaller than the limit value.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

Hereafter, preferred embodiments of the present invention will be described with reference to the accompanying drawings to fully explain the present invention in such a manner that it may easily carried out by a person with ordinary skill in the art to which the present invention pertains. In following description for each embodiment, a memory cell array configuration of a nonvolatile memory device shown in FIG. 2 will be taken as an example; however, the technical idea of the present invention is not limited thereto. A term 'interval' disclosed throughout this specification corresponds to an X-axis of each waveform diagram and means a time. In each embodiment, other bias conditions which are word line voltage, bit line voltage, control signal, and so forth. besides a program voltage during a program operation are the same as those in a typical method.

Figure 4:
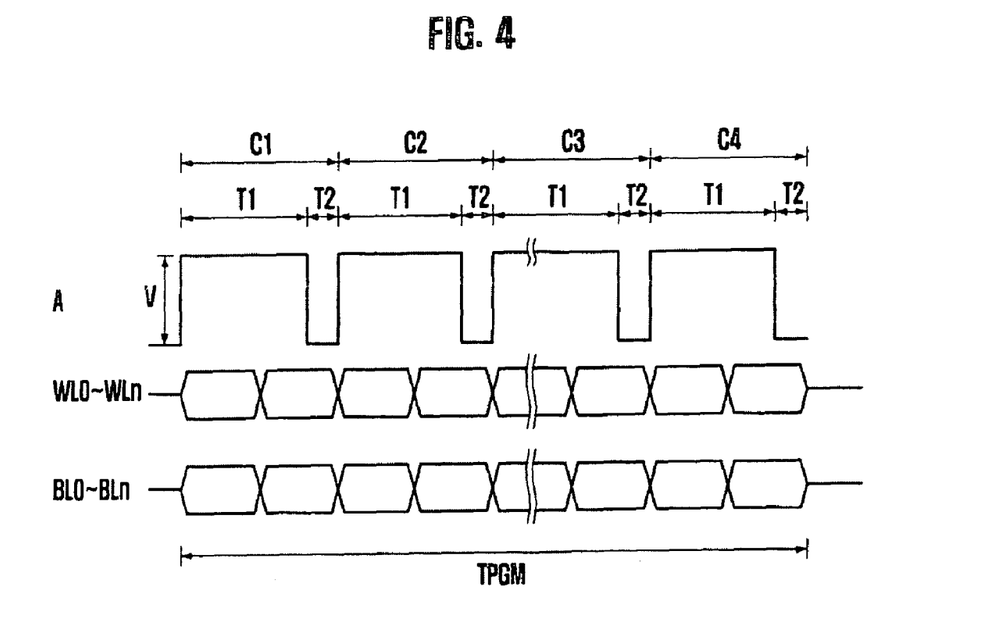
FIG. 4 is a waveform diagram illustrating a method for programming a nonvolatile memory device in accordance with an embodiment 1 of the present invention.

FIG. 4 is a waveform diagram illustrating a method for programming a nonvolatile memory device in accordance with an embodiment 1 of the present invention.

Referring to FIG. 4, a method for programming a nonvolatile memory device in accordance with the embodiment 1 of the present invention includes applying a pulse type program voltage (see A) having a plurality of cycles C1 to C4 during a programming period TPGM. The program voltage has the same amplitude V in each of the cycles C1 to C4.

Each of the cycles C1 to C4 has the same interval. Each of the cycles C1 to C4 includes a turn-on interval T1, referred to as first interval hereafter, and a turn-off interval T2, referred to as second interval hereafter, during which a voltage having a level different from that of a voltage is applied during the first interval T1. Preferably, the voltage applied during the second interval T2 has a level lower than that of the voltage applied during the first interval T1. More preferably, a high voltage VPP is applied during the first interval T1, and a ground voltage or negative voltage is applied during the second interval T2. The first interval T1 is longer than the second interval T2. Preferably, the second interval T2 is approximately ½ to approximately 1/10 of the first interval T1.

The programming method in accordance with the embodiment 1 of the present invention will be described below with reference to FIGS. 2 and 4.

First, during the first interval T1 of each cycle C1 to C4, a high voltage VPP is applied to the unit cell UC to break down the gate dielectric layer of the antifuse ANT_FS. Subsequently, during the second interval T2, the high voltage VPP applied to the unit cell UC is cut off and a ground voltage or negative voltage is applied to a terminal of the antifuse ANT_FS which is connected to the terminal A, thereby removing electrons that are trapped at an interface of the gate dielectric layer of the antifuse ANT_FS during the first interval T1.

Figure 5:
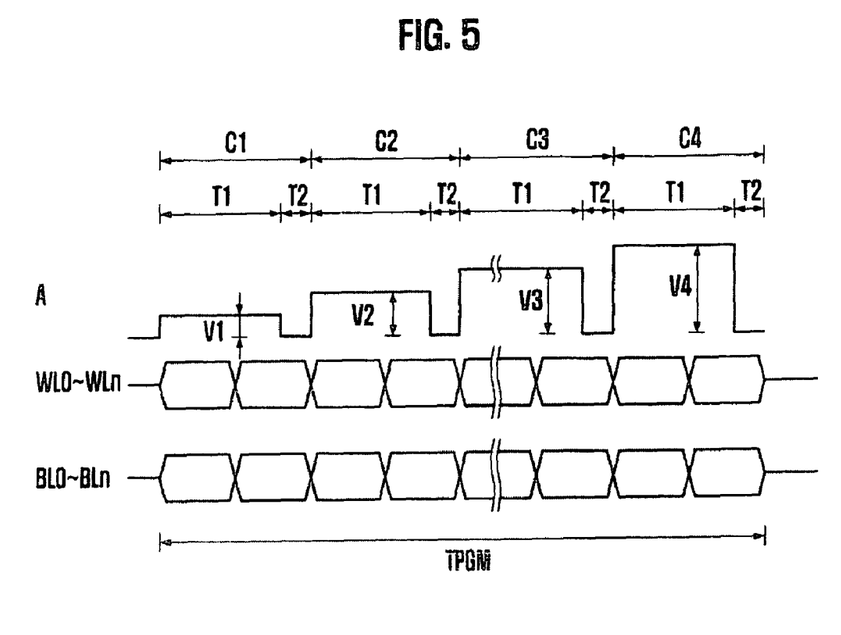
FIG. 5 is a waveform diagram illustrating a method for programming a nonvolatile memory device in accordance with an embodiment 2 of the present invention.

FIG. 5 is a waveform diagram illustrating a method for programming a nonvolatile memory device in accordance with an embodiment 2 of the present invention.

Referring to FIG. 5, like the embodiment 1, a method for programming a nonvolatile memory device in accordance with the embodiment 2 of the present invention includes applying a pulse type program voltage (see A) having a plurality of cycles C1 to C4 during a programming period TPGM. In the embodiment 2, however, the program voltage does not have the same amplitude (see V in FIG. 4) in each cycle C1 to C4 but has different amplitudes V1 to V4, respectively. Herein, the amplitude of the program voltage increases along with a progress of cycles. That is, the amplitude of the program voltage increases in order of C1, C2, C3 and C4. Amplitude differences between the respective cycles C1 to C4 may be equal or unequal to one another.

Figure 6:
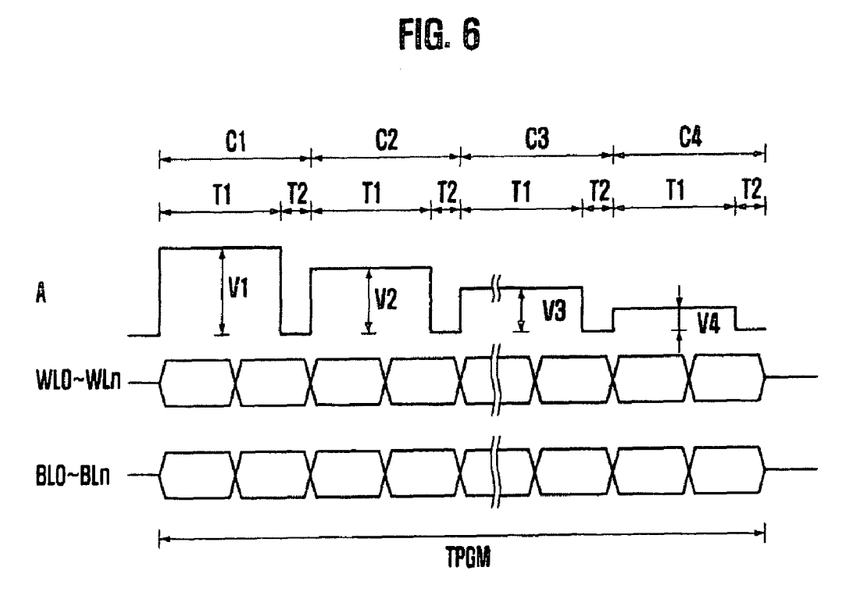
FIG. 6 is a waveform diagram illustrating a method for programming a nonvolatile memory device in accordance with an embodiment 3 of the present invention.

FIG. 6 is a waveform diagram illustrating a method for programming a nonvolatile memory device in accordance with an embodiment 3 of the present invention.

Referring to FIG. 6, in the method for programming the nonvolatile memory device in accordance with the embodiment 3 of the present invention, the amplitude of the program voltage does not increase but decreases along with a progress of cycles, which is contrary to the previous embodiment 2 of FIG. 5. That is, the amplitude decreases in order of C1, C2, C3 and C4. Likewise, amplitude differences between the respective cycles C1 to C4 may be equal or unequal to one another.

Figure 7:
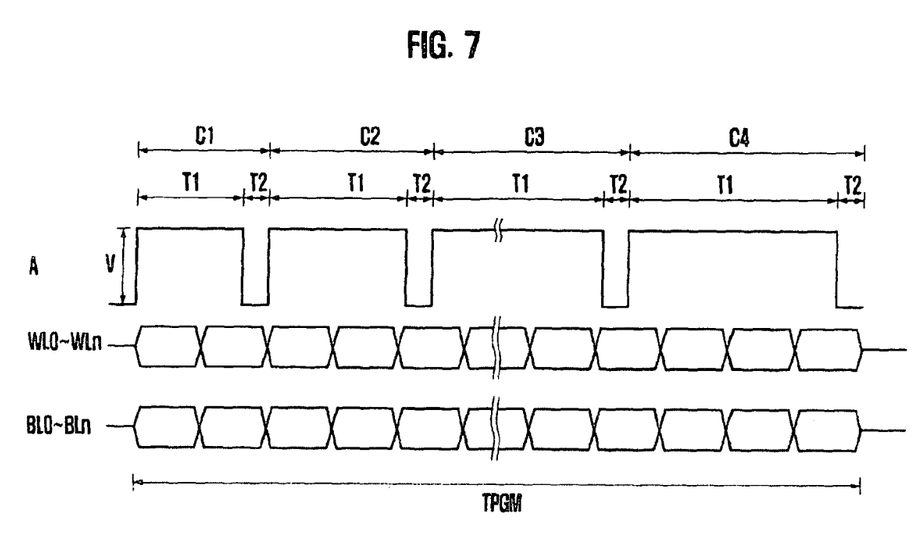
FIG. 7 is a waveform diagram illustrating a method for programming a nonvolatile memory device in accordance with an embodiment 4 of the present invention.

FIG. 7 is a waveform diagram illustrating a method for programming a nonvolatile memory device in accordance with an embodiment 4 of the present invention.

Referring to FIG. 7, like the embodiment 1, the method for programming a nonvolatile memory device in accordance with the embodiment 4 of the present invention includes applying a pulse type program voltage (see A) having a plurality of cycles C1 to C4 during a programming period TPGM. In the embodiment 4, however, intervals of the cycles C1 to C4 are not equal but they differ from one another in each cycle C1 to C4. The interval of each cycle C1 to C4 increases along with a progress of cycles. That is, the interval of the cycle increases in order of C1, C2, C3 and C4. Interval differences between the respective cycles C1 to C4 may be equal or unequal to one another.

Figure 8:
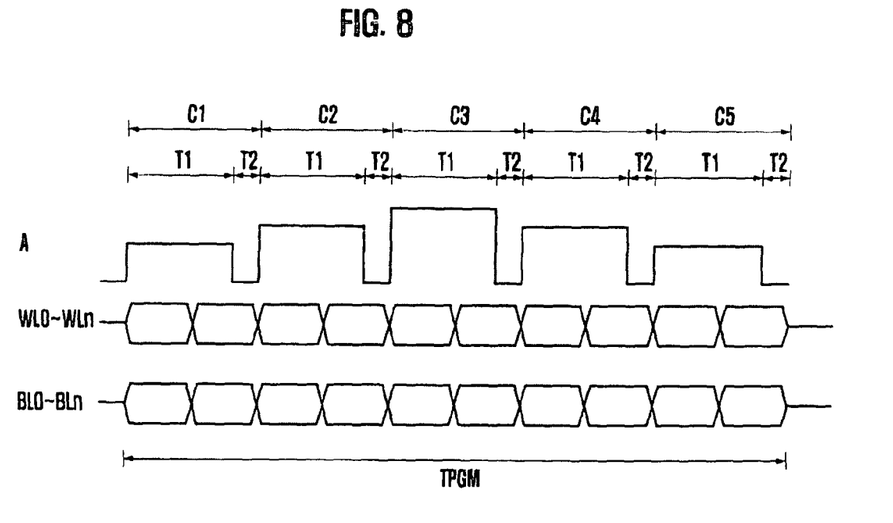
FIG. 8 is a waveform diagram illustrating a method for programming a nonvolatile memory device in accordance with an embodiment 5 of the present invention.

FIG. 8 is a waveform diagram illustrating a method for programming a nonvolatile memory device in accordance with an embodiment 5 of the present invention.

Referring to FIG. 8, the method for programming the nonvolatile memory device in accordance with the embodiment 5 of the present invention corresponds to the combination of the embodiment 2 and the embodiment 3. In the embodiment 5, the amplitude of the program voltage increases along with a progress of cycles until the cycle does not exceed a predetermined cycle, for example, the cycle C3 corresponding to half the total programming period; however, the amplitude of the program voltage decreases along with a progress of cycles beyond the cycle C3. Amplitude differences between the respective cycles C1 to C5 may be equal or unequal to one another.

Figure 9:
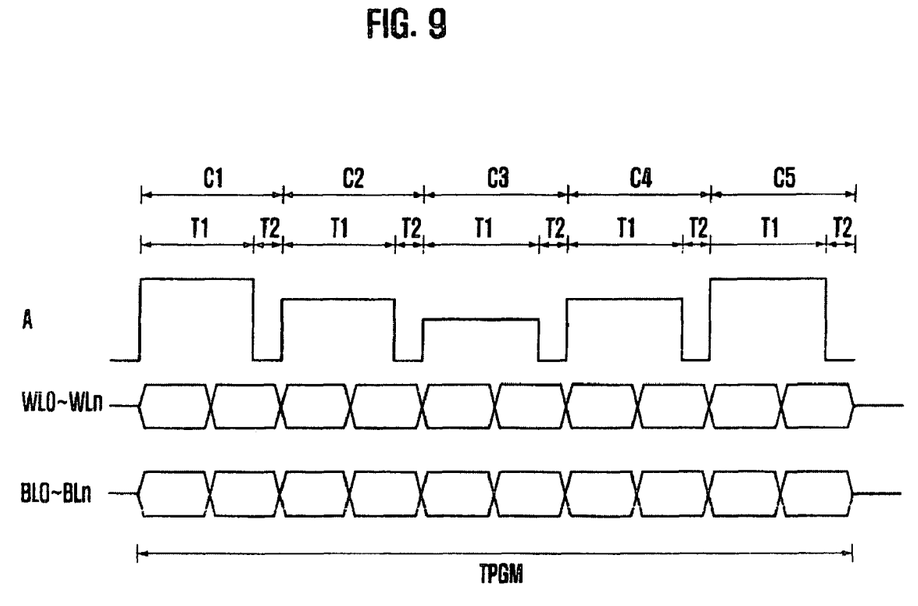
FIG. 9 is a waveform diagram illustrating a method for programming a nonvolatile memory device in accordance with an embodiment 6 of the present invention.

FIG. 9 is a waveform diagram illustrating a method for programming a nonvolatile memory device in accordance with an embodiment 6 of the present invention.

Referring to FIG. 9, the method of the nonvolatile memory device in accordance with the embodiment 6 of the present invention is contrary to that of the embodiment 5. In the embodiment 6, the amplitude of the program voltage decreases along with a progress of cycles until the cycle does not exceed a predetermined cycle, for example, the cycle C3 corresponding to half the total programming period; however, the amplitude of the program voltage increases along with a progress of cycles beyond the cycle C3. Also, amplitude differences between the respective cycles C1 to C5 may be equal or unequal to one another.

Figure 10:
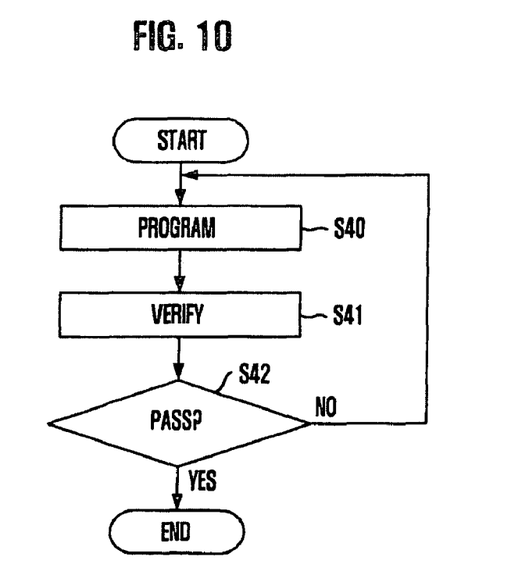
FIG. 10 is a flowchart illustrating a method for programming a nonvolatile method in accordance with an embodiment 7 of the present invention.
Figure 11:
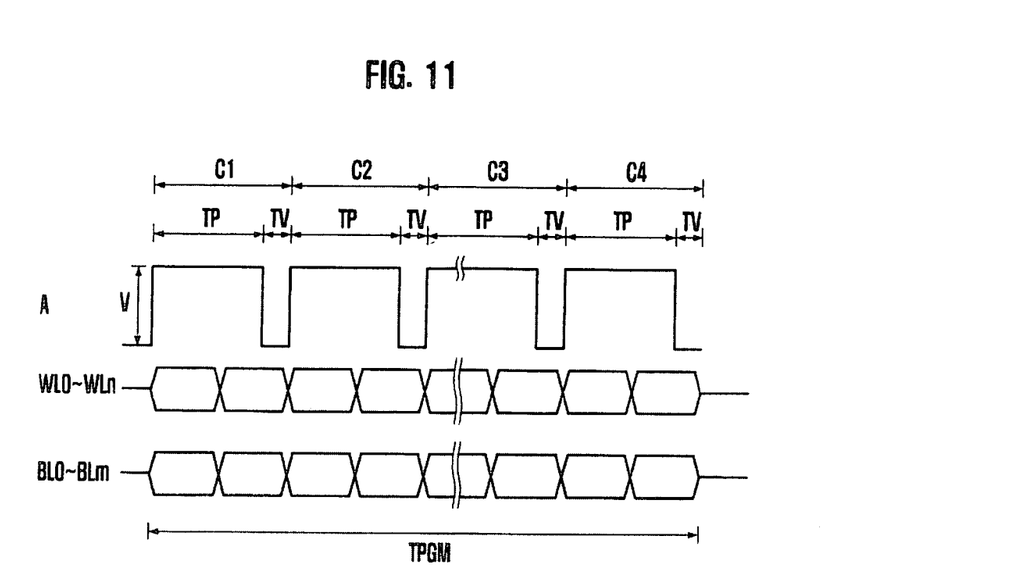
FIG. 11 is a waveform diagram illustrating the method for programming the nonvolatile method in accordance with the embodiment 7 of the present invention.

FIG. 10 is a flowchart illustrating a method for programming a nonvolatile method in accordance with an embodiment 7 of the present invention, and FIG. 11 is a waveform diagram illustrating signals in FIG. 2.

Referring to FIGS. 10 and 11, in the method for programming the in accordance with the embodiment 7, a program operation (S40) and a verify operation (S41 and S42) are performed within one cycle during a program interval TPGM of the OTP unit cell UC. To be specific, the program operation is performed for a first interval TP and the verify operation is performed for an interval TV, and they are repeated depending on the verification result.

The programming period TPGM includes a plurality of cycles C1 to C4. Each of the cycles C1 to C4 includes the first interval TP for program operation and the second interval TV for verify operation. A program voltage A having a fixed amplitude V is applied to an anti-fuse ANT_FS (see FIG. 2) during only the first interval TP, and is not applied during the second interval TV. For example, the program voltage A applied during the second interval TV is equal to a ground voltage, i.e., 0 V.

The verify operation includes: performing a read operation on the OTP unit cell UC on which the program operation has been performed; and comparing data, which is detected from the OTP unit cell UC during the read operation, with a reference value. The read operation may be performed in the same manner as the aforesaid read operation of the OTP unit cell. The operation of comparing the detected data with the reference value is performed through a detecting unit (not shown) connected to bit lines (BL0 to BLm, see FIG. 2). For example, a comparator (not shown) compares the data of the OTP unit cell UC detected through a sense amplifier with the preset reference value.

When the verification result shows that the data of the OTP unit cell UC is not equal to the reference value, a next-cycle operation is performed. For example, when the data of the OTP unit cell UC differs from the reference value in the second interval TV of the cycle C1, the next-cycle operation is performed during the cycle C2. The next-cycle operation continues to be performed until the data of the OTP unit cell UC becomes equal to the reference value.

The program voltage A having the same amplitude V is used in the first interval TP of each cycle C1 to C4. Although not shown, the program voltage may have different amplitudes in the first interval TP of each cycle C1 to C4. In this case, the amplitude of the program voltage may increase as the cycle increases in order of C1, C2, C3 and C4. Alternatively, the amplitude may increase along with a progress of cycles at the same or different rates. For example, if the program voltage of the cycle C2 is higher than that of the cycle C1 by 0.5 V, the program voltage of the cycle C3 is also higher than that of the cycle C2 by 0.5 V.

The first intervals TP taker for the respective program operations during the cycles C1 to C4 are equal to one another. Although not shown, the first intervals TP taken for the respective program operations of the cycles C1 to C4 may differ from one another. In this case, the first interval TP may increase as the cycle increases in order of C1, C2, C3 and C4. Alternatively, the first interval TP may increase along with a progress of cycles at the same or different rates. For example, if the programming interval of the cycle C2 is longer than that of the cycle C1 by 0.5 second, the programming interval of the cycle C3 is also longer than that of the cycle C2 by 0.5 second.

Although not shown, the program voltage used during the first interval TP of each cycle C1 to C4 may have a pulse type. Herein, the pulse type program voltage means that voltages having different amplitudes are periodically inputted at regular cycles.

Figure 12:
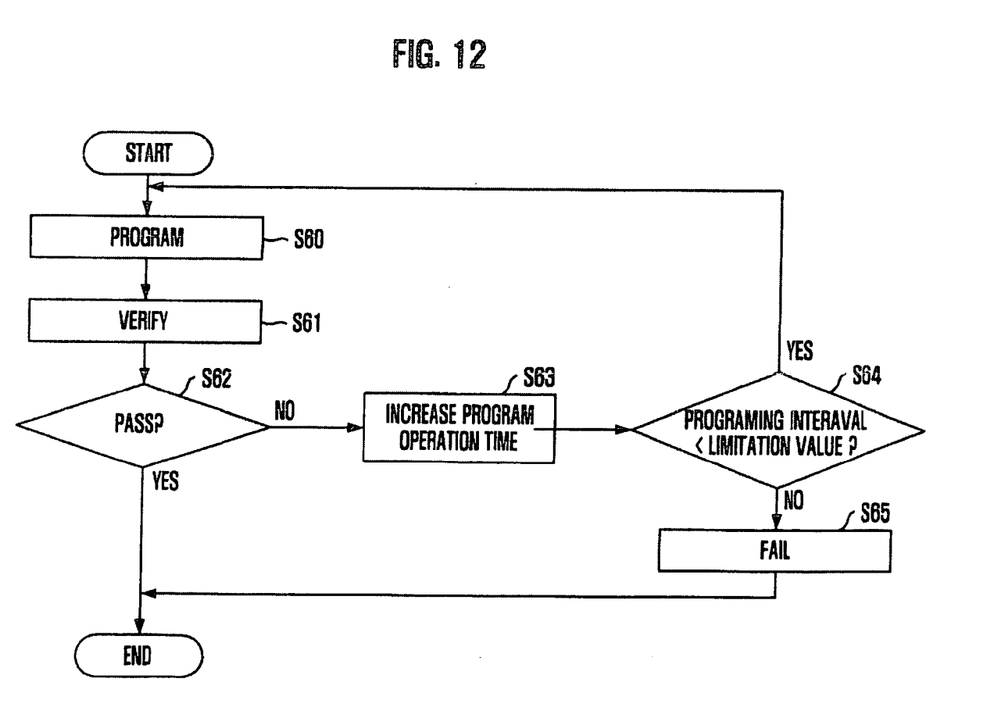
FIG. 12 is a flowchart illustrating a method for programming a nonvolatile method in accordance with an embodiment 8 of the present invention.
Figure 13:
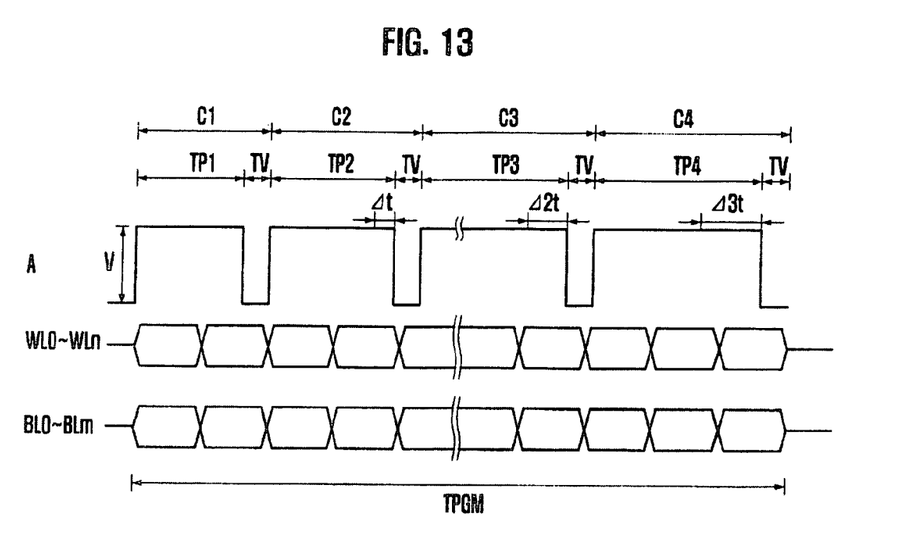
FIG. 13 is a waveform diagram illustrating the method for programming the nonvolatile method in accordance with the embodiment 8 of the present invention.

FIG. 12 is a flowchart illustrating a method for programming a nonvolatile method in accordance with an embodiment 8 of the present invention, and FIG. 13 is a waveform diagram illustrating signals in FIG. 2.

Referring to FIGS. 12 and 13, like the embodiment 7, the method for programming the nonvolatile memory device in accordance with the embodiment 8 of the present invention includes a program operation (S60) and a verify operation (S61 and S62). Since the program operation (S60) and the verify operation (S61 and S62) are performed in the same manner as the embodiment 7, detailed description for them will be omitted herein.

The program method in accordance with the embodiment 8 of the present invention increases a programming interval by Δt when the unit cell does not pass the verify operation (S61 and S62). For example, when the unit cell does not pass the verify operation during the cycle C1, the program operation is performed during the cycle C2 for a time that is longer than the programming interval of the program operation performed in the cycle C1 by Δt, or the program operation is additionally performed for the increased programming interval Δt after it is performed for the same programming interval of the cycle C1. More specifically, if the programming interval during the cycle C1 is 5 seconds during the cycle C1 and Δt is 0.5 second, the program operation during the cycle C2 may be performed for 5.5 seconds, or further performed only for 0.5 second after it has been performed for 5 seconds.

However, the programming interval cannot be infinitely increased because it is strongly correlated with the dielectric breakdown of the antifuse, as described already in the Description of Related Art. This is because the increase of the programming interval does not always improve the dielectric breakdown characteristic of the antifuse proportionally. That is, the dielectric breakdown characteristic of the antifuse is improved up to a predetermined time as the programming interval increases; however, it is saturated after the predetermined time and thus not enhanced any more.

Therefore, in the program method in accordance with the embodiment 8 of the present invention, the programming interval is increased by Δt, and the increased programming interval is compared with the preset limit value (S64). When the increased programming interval is less than or equal to the preset limit value, the program operation (S30) is performed again during a next-cycle; otherwise, a corresponding OTP unit cell is treated as a defect (S65). The limit value may be appropriately selected in consideration of a program voltage level, which is an electric potential, and the dielectric breakdown characteristics of the gate dielectric layer, which include a gate size, a gate thickness, and a gate dielectric material.

Figure 14:
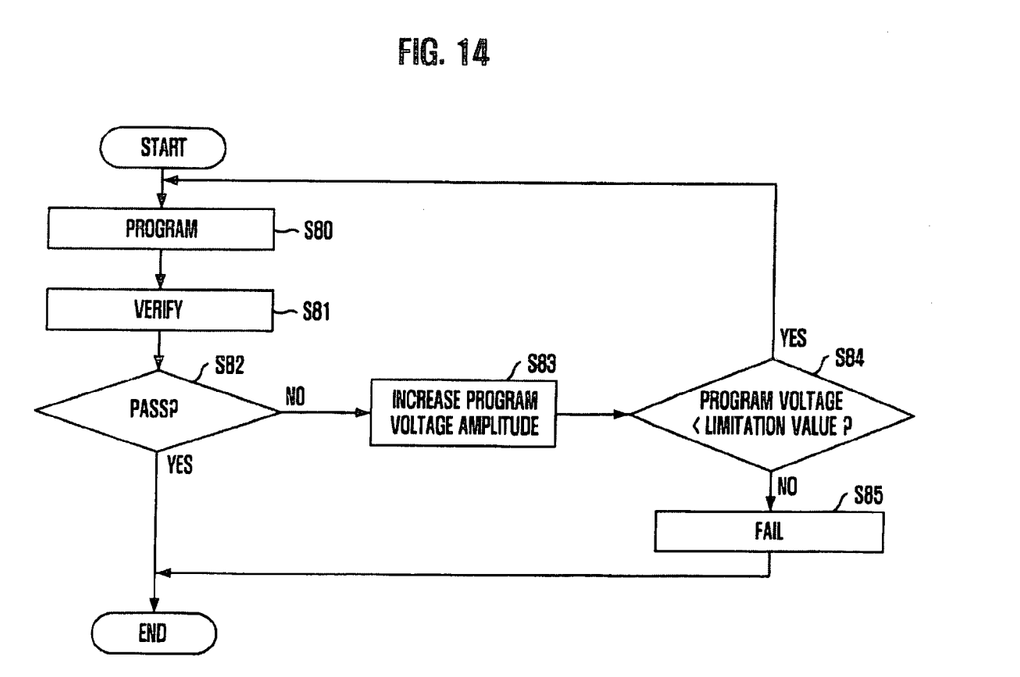
FIG. 14 is a flowchart illustrating a method for programming a nonvolatile method in accordance with an embodiment 9 of the present invention.
Figure 15:
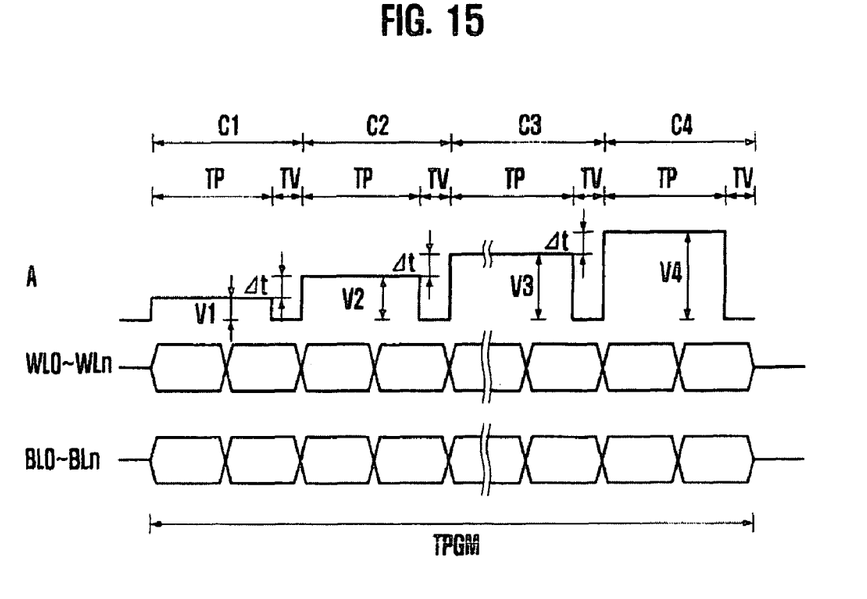
FIG. 15 is a waveform diagram illustrating the method for programming the nonvolatile method in accordance with the embodiment 9 of the present invention.

FIG. 14 is a flowchart illustrating a method for programming a nonvolatile method in accordance with an embodiment 9 of the present invention, and FIG. 15 is a waveform diagram illustrating signals in FIG. 2.

Referring to FIGS. 14 and 15, like the embodiment 7, the method for programming the nonvolatile memory device in accordance with the embodiment 8 of the present invention includes a program operation (S80) and a verify operation (S81 and S82). Since the program operation (S80) and the verify operation (S81 and S82) are performed in the same manner as the embodiment 7, detailed description for them will be omitted herein.

The program method in accordance with the embodiment 9 of the present invention increases an amplitude of a program voltage by ΔV when the unit cell does not pass the verify operation (S81 and S82). For example, when the unit cell does not pass the verify operation during the cycle C1, the program operation is performed during the cycle C2 with a program voltage of which an amplitude is greater than that of the program voltage of the cycle C1 by ΔV. More specifically, if the program voltage during the cycle C1 is 5 V during the cycle C1 and ΔV is 0.5 V, the program operation during the cycle C2 may be performed with the program voltage of 5.5 V.

After the program voltage is increased by ΔV, the increased voltage is compared with a preset limit value (S84). When the increased program voltage is less than or equal to the limit value, the program operation (S80) is performed again during a next-cycle; otherwise, a corresponding cell is treated as a defect (S85). The limit value may be appropriately selected in consideration of the dielectric breakdown characteristic of the gate dielectric layer which is the gate size, the gate thickness, and the gate dielectric material) of the antifuse ANT_FS.

Figure 16:
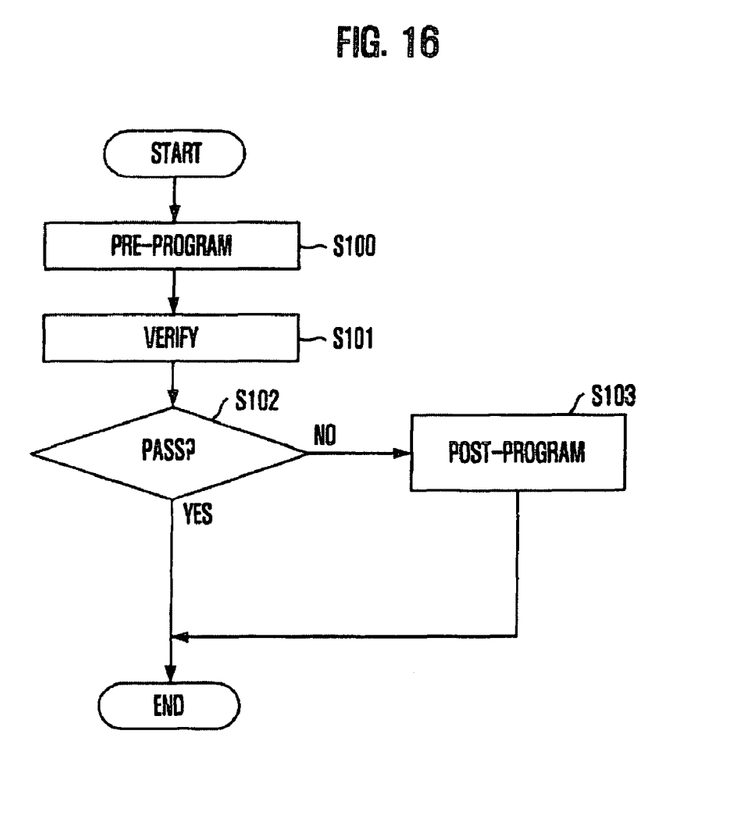
FIG. 16 is a flowchart illustrating a method for programming a nonvolatile method in accordance with an embodiment 10 of the present invention.
Figure 17:
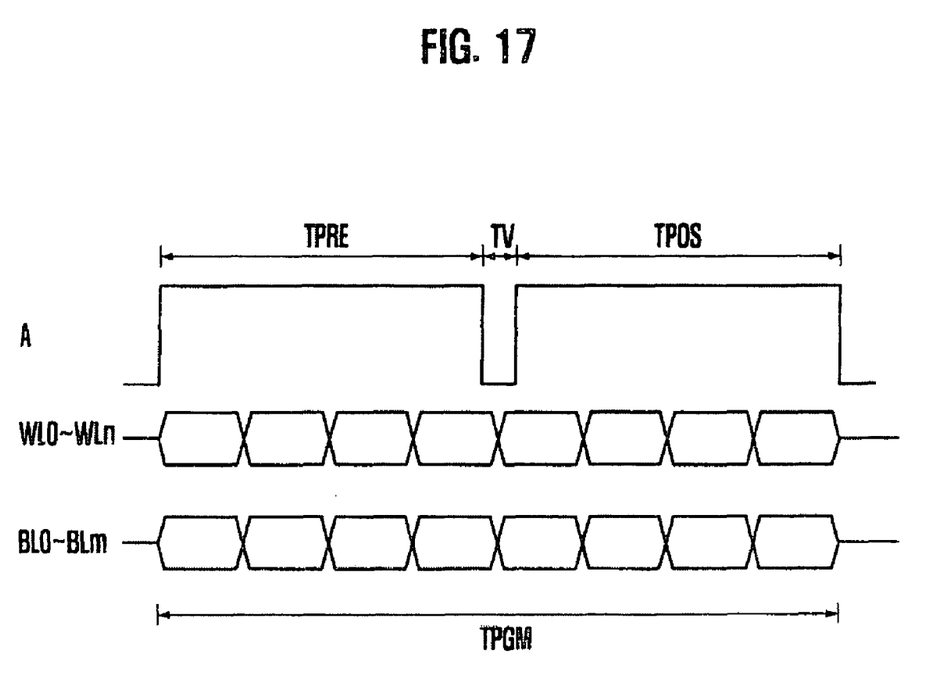
FIG. 17 is a waveform diagram illustrating the method for programming the nonvolatile method in accordance with the embodiment 10 of the present invention.

FIG. 16 is a flowchart illustrating a method for programming a nonvolatile method in accordance with an embodiment 10 of the present invention, and FIG. 17 is a waveform diagram illustrating signals in FIG. 2.

Referring to FIGS. 16 and 17, a pre-program operation is performed on a corresponding OTP unit cell UC for a pre-program interval TPRE within a programming period (T0PGM (S100). The pre-program operation may be selectively performed on 1-bit OTP cell or multi-bit OTP cells. In addition, the pre-program operation may be performed using a pulse type program voltage.

A verify operation is performed for a second interval TV on the OTP unit cell on which the pre-program operation is completed (S101 and S102). The verify operation is performed in the same manner as the verify operation illustrated in the embodiment 7.

When the verification result shows that the data of the OTP unit cell UC is not equal to a preset reference value, a post-program operation is performed for a post-program interval TPOS (S103). For example, when the data of the OTP unit cell UC is less than the reference value, the post-program operation is performed.

The post-program operation may be performed using a program voltage having the same amplitude as the pre-program operation or performed using program voltages having different amplitudes (not shown). In case of using the program voltages having different amplitudes, the post-program operation may be performed using a program voltage having an amplitude higher than the program voltage of the pre-program operation. Furthermore, the post-program operation may be performed using a pulse type program voltage (not shown) having a plurality of cycles like the pre-program operation.

The post-program interval TPOS may be equal to the pre-program interval TPRE. Also, although not shown, the post-program interval TPOS may differs from the pre-program interval TPRE. When the pre-program operation and the post-program operation are performed for different program intervals, the post-program interval TPOS may be longer than the pre-program interval TPRE.

In accordance with the present invention, there are several advantageous effects as follows.

First, electrons, which are trapped at an interface of a gate dielectric layer of an antifuse in a unit cell to cause electric field strength to be reduced, can be removed from the interface of the gate dielectric layer because a program operation is performed in such a way that a pulse type program voltage is applied during the program operation of a nonvolatile memory device. Consequently, it is possible to minimize the reduction in electric field strength and prevent malfunctions, thus improving the reliability in the read operation of an OTP unit cell.

Second, a program operation and a verify operation are repeated during a programming period, and the program operation is performed by increasing an amplitude of a program voltage or a programming interval only when a unit cell fails to pass the verify operation. Therefore, the program operation can be performed using a relatively low program voltage at an initial stage, which makes it possible to minimize the stress applied to the unit cell.

Third, since a program operation and a verify operation are repetitively performed during a programming period such that a next-cycle program operation is not performed on a unit cell that has passed the verify operation during a previous cycle but performed on a unit cell not passing the verify operation, it is possible to minimize the resistance non-uniformity of a unit cell caused by characteristic non-uniformity of each unit cell in case where a multi-bit program operation is performed on a plurality of unit cells.

To be specific, when a program operation is performed on a plurality of unit cells, respective unit cells may have different dielectric breakdown characteristics of a gate dielectric layer of an antifuse due to their own characteristics. In this case, it is difficult to ensure the resistance uniformity of the unit cell in a memory cell array after the program operation. Accordingly, in the method of the present invention, a program operation and a verify operation are repetitively performed during a programming period in such a manner that the program operation is performed with a low program voltage at an initial stage and then performed while increasing an amplitude of the program voltage or a programming interval according to a progress of cycles. Consequently, uniform resistance can be obtained over a plurality of unit cells in the memory cell array.

Fourth, electrons, which are trapped at an interface of a gate dielectric layer of an antifuse in a unit cell to cause electric field strength to be reduced, can be removed from the interface of the gate dielectric layer because a program operation is performed using a pulse type program voltage. Consequently, the reduction in electric field can be minimized and malfunctions can be prevented, thus improving the reliability in the read operation of an OTP unit cell.

As described above, although the technical idea of the present invention is specifically disclosed in the preferred embodiments, it is noted that they are merely provided for explanation while not limiting the present invention. It is also possible to realize the present invention by combining the embodiment where respective cycles are different from one another and the embodiment where respective amplitudes are different from one another, for example, combining the embodiments 4 and 2, the embodiments 4 and 3, the embodiments 4 and 5, the embodiments 4 and 6, and the like. In addition, it will be appreciated by a person of ordinary skill in the art that various changes and modifications may be made without departing from the spirit and scope of the invention through combinations of the embodiments 1 through 10.

What is claimed is:

1. A method for programming a nonvolatile memory device including one time programmable (OTP) unit cells, the method comprising:
    applying a pulse type program voltage having a plurality of cycles, each of the cycles including a first interval and a second interval,
    wherein the second interval has a length that is in a range of approximately ½ to approximately 1/10 of a length of the first interval.

2. The method of claim 1, wherein a sum of the lengths of the first and second intervals is the same in each of the cycles.

3. The method of claim 2, wherein the program voltage has the same amplitude in each of the cycles.

4. The method of claim 2, wherein the program voltage of at least one of the cycles has an amplitude that is different from an amplitude of an other one of the cycles.

5. The method of claim 4, wherein amplitudes of the program voltage increase along with a progress of the cycles.

6. The method of claim 4, wherein amplitudes of the program voltage decrease along with a progress of the cycles.

7. The method of claim 4, wherein amplitudes of the program voltage increase along with a progress of the cycles up to a preset cycle, and amplitudes of the program voltage decrease along with a progress of the cycles from the preset cycle.

8. The method of claim 4, wherein amplitudes of the program voltage decrease along with a progress of the cycles up to a preset cycle, and amplitudes of the program voltage increase along with a progress of the cycles from the preset cycle.

9. The method of claim 2, wherein a voltage applied during the second interval is different from a voltage applied during the first interval.

10. The method of claim 2, wherein a voltage level applied during the second interval is less than a voltage level applied during the first interval.

11. The method of claim 10, wherein a high voltage is applied during the first interval, and a ground voltage or a negative voltage is applied during the second interval.

12. The method of claim 5, wherein the amplitudes of the program voltage increase along with a progress of the cycles at the same rate.

13. The method of claim 5, wherein the amplitudes of the program voltage increase along with a progress of the cycles at different rates.

14. A method for programming a nonvolatile memory device including one time programmable (OTP) unit cells, the method comprising:
applying a pulse type program voltage having a plurality of cycles, each of the cycles having intervals,
wherein lengths of intervals in at least one of the cycles are different from lengths of intervals in an other one of the cycles.

15. The method of claim 14, wherein the lengths of the intervals of the cycles increase along with a progress of the cycles.

16. The method of claim 14, wherein the lengths of the intervals of the cycles decrease along with a progress of the cycles.

17. The method of claim 14, wherein the program voltage has the same amplitude in each of the cycles.

18. The method of claim 14, wherein the program voltage of at least one of the cycles has an amplitude that is different from an amplitude of an other one of the cycles.

19. The method of claim 18, wherein amplitudes of the program voltage increase along with a progress of the cycles.

20. The method of claim 18, wherein amplitudes of the program voltage decrease along with a progress of the cycles.

21. The method of claim 18, wherein amplitudes of the program voltage increase along with a progress of the cycles up to a preset cycle, and amplitudes of the program voltage decrease along with a progress of the cycles from the preset cycle.

22. The method of claim 18, wherein amplitudes of the program voltage decrease along with a progress of the cycles up to a preset cycle, and amplitudes of the program voltage increase along with a progress of the cycles from the preset cycle.

23. The method of claim 14, wherein each of the cycles includes a first interval and a second interval during which a voltage having a level different from that of a voltage applied during the first interval is applied.

24. The method of claim 14, wherein each of the cycles includes a first interval and a second interval during which a voltage having a level less than that of a voltage applied during the first interval is applied.

25. The method of claim 24, wherein the first interval has a length that is greater than a length of the second interval.

26. The method of claim 24, wherein the second interval has a length that is approximately ½ to approximately ¹/₁₀ of a length of the first interval.

27. The method of claim 24, wherein a high voltage is applied during the first interval, and a ground voltage or a negative voltage is applied during the second interval.

28. The method of claim 19, wherein the intervals increase along with a progress of the cycles at the same rate.

29. The method of claim 19, wherein the intervals increase along with a progress of the cycles at different rates.

30. A method for programming a nonvolatile memory device including one time programmable (OTP) unit cells, the method comprising:
applying a pulse type program voltage having a plurality of cycles,
wherein a program operation and a verify operation are performed within one of the cycles, and a next-cycle operation is performed depending on a result of the verify operation.

31. The method of claim 30, wherein the verify operation comprises:
performing a read operation on an OTP unit cell; and
comparing data detected from the OTP unit cell during the read operation with a reference value.

32. The method of claim 31, wherein the next-cycle operation is performed when the data differs from the reference value.

33. The method of claim 31, wherein the next-cycle operation continues to be performed until the data becomes equal to the reference value.

34. The method of claim 31, further comprising:
performing the program operation on the OTP unit cell during a preset programming interval of the one of the cycles;
increasing the preset programming interval when the detected data differs from the reference value;
comparing the increased interval with a preset limit value; and
performing the next-cycle operation on the OTP unit cell for the increased interval when the increased interval is smaller than the preset limit value.

35. The method of claim 31, further comprising:
performing the program operation on the OTP unit cell with a preset program voltage of the one of the cycles;
increasing an amplitude of the program voltage when the detected data differs from the reference value;
comparing the increased amplitude with a preset limit value; and
performing the next-cycle operation on the OTP unit cell for the program voltage when the increased amplitude is smaller than the preset limit value.

* * * * *